(12) United States Patent
Kim et al.

(10) Patent No.: US 7,750,348 B2
(45) Date of Patent: Jul. 6, 2010

(54) DISPLAY DEVICE HAVING CRYSTAL GRAIN BOUNDARIES PROVIDING SUPERIOR DRIVING AND LUMINANCE CHARACTERISTICS

(75) Inventors: Ok-Byoung Kim, Yongin (KR); Ki-Yong Lee, Yongin (KR); Ji-Yong Park, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 295 days.

(21) Appl. No.: 10/687,993

(22) Filed: Oct. 20, 2003

(65) Prior Publication Data
US 2004/0085268 A1 May 6, 2004

(30) Foreign Application Priority Data
Nov. 5, 2002 (KR) .................. 10-2002-0068232

(51) Int. Cl.
*H01L 29/02* (2006.01)
*H01L 29/04* (2006.01)
(52) U.S. Cl. .................. 257/72; 257/347; 257/66
(58) Field of Classification Search .................. 313/506, 313/500; 345/76; 257/72, 66, 347
See application file for complete search history.

(56) References Cited

U.S. PATENT DOCUMENTS

| | | | | |
|---|---|---|---|---|
| 5,759,879 A | * | 6/1998 | Iwasaki | 438/166 |
| 5,923,997 A | * | 7/1999 | Mitanaga et al. | 438/486 |
| 6,117,752 A | | 9/2000 | Suzuki | |
| 6,160,272 A | | 12/2000 | Arai et al. | |
| 6,177,301 B1 | * | 1/2001 | Jung | 438/150 |
| 6,177,391 B1 | | 1/2001 | Zafar | 510/131 |
| 6,255,146 B1 | * | 7/2001 | Shimizu et al. | 438/162 |
| 6,322,625 B2 | | 11/2001 | Im | 117/43 |
| 2002/0043662 A1 | * | 4/2002 | Yamazaki et al. | 257/72 |

FOREIGN PATENT DOCUMENTS

| | | |
|---|---|---|
| JP | 8-330600 | 12/1996 |
| JP | 10-254383 | 9/1998 |
| JP | 11-064883 | 3/1999 |
| JP | 2000-243968 | 9/2000 |
| KR | 2000-1168 | 1/2000 |

OTHER PUBLICATIONS

Korean Patent Abstract for Publication No. 10-2000-0001168, published Jan. 15, 2000.

* cited by examiner

*Primary Examiner*—Karabi Guharay
(74) *Attorney, Agent, or Firm*—Stein McEwen, LLP

(57) ABSTRACT

A display device with a polysilicon substrate, including a display region, a first plurality of thin film transistors in the display region, and primary crystal grain boundaries in the polysilicon substrate in the display region, wherein the primary crystal grain boundaries are inclined to a first direction of current flowing from source to drain of each of the first plurality of thin film transistors at an angle of −30° to 30°.

9 Claims, 7 Drawing Sheets

DISPLAY DEVICE HAVING CRYSTAL GRAIN BOUNDARIES PROVIDING SUPERIOR DRIVING AND LUMINANCE CHARACTERISTICS

CROSS-REFERENCE TO RELATED APPLICATIONS

This application claims the benefit of Korean Application No. 2002-68232, filed Nov. 5, 2002, in the Korean Intellectual Property Office, the disclosure of which is incorporated herein by reference.

BACKGROUND OF THE INVENTION

1. Field of the Invention

The present invention relates to a display device, and, more particularly, to a display device having superior driving characteristics and luminance characteristics.

2. Description of the Related Art

During fabrication of a thin film transistor (TFT) using polycrystalline silicon, bonding defects, such as dangling bonds existing on crystal grain boundaries of the polycrystalline silicon included in an active channel region, are known to function as traps for electric charge carriers.

Therefore, the size, size uniformity, number, position, and direction of crystal grains not only have a fatal effect upon TFT characteristics such as threshold voltage (Vth), sub-threshold slope, charge carrier mobility, leakage current, and device stability, directly and indirectly, but these characteristics also have a fatal effect upon the uniformity of TFTs, depending on the position of the crystal grains during fabrication of an active matrix display substrate using TFTs.

The number of fatal crystal grain boundaries (hereinafter referred to as "primary" crystal grain boundaries) included in the active channel regions of TFTs on the whole substrate of a display device can be equivalent or different according to the size of the crystal grains, the inclination angle $\theta$, the dimension of active channels (of length L and width W), and the position of each TFT on the substrate (FIG. 1A and FIG. 1B).

As illustrated in FIG. 1A and FIG. 1B, if the maximum number of crystal grain boundaries is Nmax, that is, the number of "primary" crystal grain boundaries included in the active channel regions for a size of crystal grains Gs, active channel dimension L×W, and inclination angle $\theta$, the number of "primary" crystal grain boundaries included in the active channel regions according to a position of the TFT on a substrate or display device will be Nmax (3 in case of FIG. 1B) or Nmax−1 (2 in case of FIG. 1A), and the uniformity of the most excellent TFT characteristics can be secured when Nmax "primary" crystal grain boundaries are included in the active channel regions for all of the TFTs. That is, the more equal the number of crystal grain boundaries each TFT has, the more excellent uniformity a device obtains.

On the other hand, if the number of TFTs having Nmax "primary" crystal grain boundaries is equivalent to the number of TFTs having Nmax−1 "primary" crystal grain boundaries, it can be easily expected that uniformity is the worst in the characteristics of the TFTs on a TFT substrate or a display device.

As illustrated in FIG. 2A and FIG. 2B, polycrystalline, or single crystalline, particles are capable of forming large silicon grains on a substrate using the sequential lateral solidification (SLS) crystallization method, and it is reported that characteristics similar to the characteristics of TFTs fabricated of single crystalline silicon are obtained when fabricating a TFT using the large silicon grains.

However, numerous TFTs for driver and pixel arrays must be fabricated to fabricate an active matrix display. For example, approximately one million pixels are made in fabricating an active matrix display having SVGA resolution. One TFT is required in each pixel in the case of a liquid crystal display (LCD), and at least two or more TFTs per pixel are required in a display using an organic luminescent substance (for example, an organic electroluminescent device).

Therefore, it is impossible to fabricate TFTs by growing a certain number of crystal grains, in a certain direction only, for the active channel regions of each of one million to two million, or more, TFTs.

As a method to realize this, technology for transforming amorphous silicon on the whole substrate into polycrystalline silicon, or crystallizing the selected region only on the substrate by the SLS crystallization method after depositing amorphous silicon by PECVD, LPCVD, or sputtering, is disclosed referring to FIG. 2A and FIG. 2B, as disclosed in U.S. Pat. No. 6,322,625.

The selected region is also a considerably large region compared to an active channel region having a dimension of several μm×several μm. Furthermore, the size of the laser beam used in the SLS crystallization method is approximately several mm×dozens of mm, and the stepping and shifting of the laser beam or stage are essentially required to crystallize amorphous silicon of the whole region or selected region on a substrate, wherein misalignment between the regions on which the laser beam is irradiated exists. Therefore, the number of "primary" crystal grain boundaries included in the numerous active channel regions of the TFTs varies, and TFTs on the whole substrate, or in the driver region and the pixel cell region, have unpredictable nonuniformity. The nonuniformity has a fatal adverse effect on the embodiment of an active matrix display device.

Furthermore, it is disclosed in U.S. Pat. No. 6,177,391 that a barrier effect of crystal grain boundaries in the direction of the electric charge carrier is minimized, in the case that the direction of the active channels is parallel to the direction of the crystal grains grown by the SLS crystallization method when fabricating a TFT for LCD devices, including a driver and pixel array, by forming large silicon grains using the SLS crystallization method as illustrated in FIG. 3A. Therefore, TFT characteristics being second to single crystalline silicon can be obtained. On the other hand, crystal grain boundaries in which TFT characteristics act as a trap of the electric charge carriers exist, and TFT characteristics are greatly deteriorated, in the case that the direction of the active channels is perpendicular to the growing direction of the crystal grains, as illustrated in FIG. 3B.

Actually, there are cases in which TFTs in driver circuits are generally inclined to TFTs in pixel cell regions at an angle of 90° when fabricating an active matrix display, wherein the uniformity of the device can be improved by fabricating TFTs in such a way that the direction of the active channel regions is inclined to the crystal grain growing direction at an angle of 30 to 60° to improve the uniformity of characteristics between TFTs, as characteristics of each TFT are not greatly deteriorated, as illustrated in FIG. 3C.

However, there is a probability that fatal crystal grain boundaries are included in the active channel regions since this method also uses crystal grains having a limited size formed by the SLS crystallization method. Therefore, this method has problems in that unpredictable nonuniformity exists, causing differences of characteristics between the TFTs.

Furthermore, an item that should be considered along with the improvement of TFT characteristics is the uniformity of TFTs for driving pixels inside a panel.

It is difficult to realize uniform image quality of a display when characteristics are varied according to the position of a TFT in a substrate, even when the TFT shows good characteristics, particularly when the threshold voltage, that is, the turn-on voltage, of the TFT varies according to the position of the substrate.

Therefore, as a crystallization method that is capable of increasing the size of crystal grains and controlling the growing direction of the crystal grains, such as, for example, the SLS method, is developed, it is necessary to design and fabricate a TFT substrate that is suitable for the developed method.

SUMMARY OF THE INVENTION

The present invention is suggested to solve the foregoing and/or other problems, and it is an aspect of the present invention to provide a display device having superior driving characteristics and luminance characteristics.

In order to achieve the foregoing and/or other aspects, the present invention provides a display device with a polysilicon substrate, comprising a display region, a first plurality of thin film transistors in the display region, and primary crystal grain boundaries in the polysilicon substrate in the display region, wherein the primary crystal grain boundaries are inclined to a first direction of current flowing from source to drain of each of the first plurality of thin film transistors at an angle of −30° to 30°.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1A:
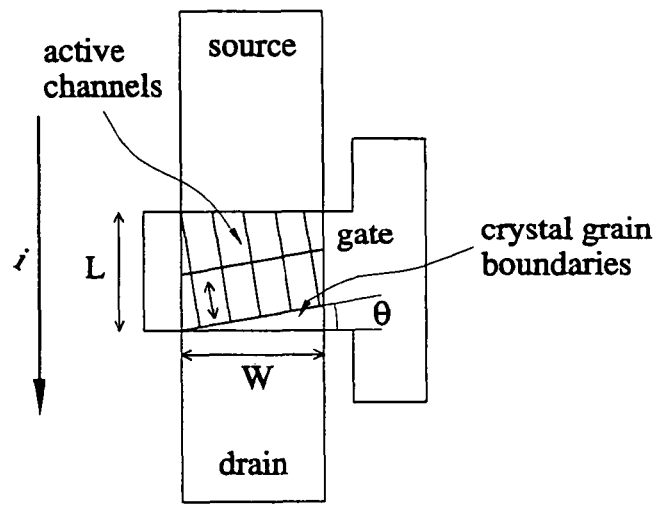
FIG. 1A is a plan figure schematically illustrating a TFT in which the number of fatal crystal grain boundaries, for the size of equal crystal grains Gs, and the dimension of active channels L×W, is 2.
Figure 1B:
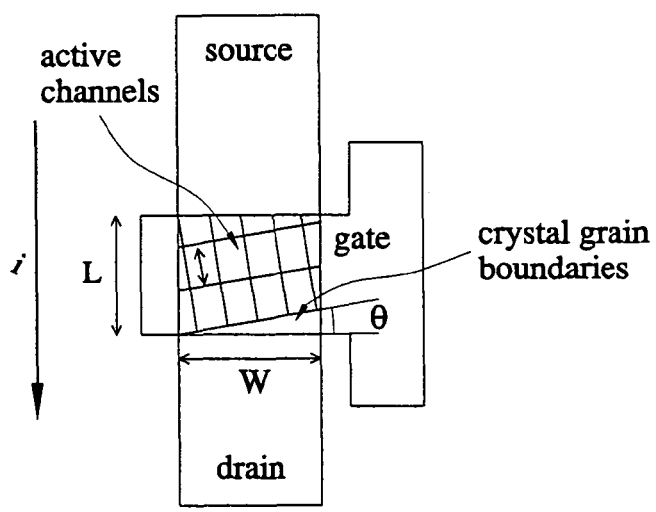
FIG. 1B is a plan figure schematically illustrating a TFT in which the number of fatal crystal grain boundaries is 3.
Figure 2A:
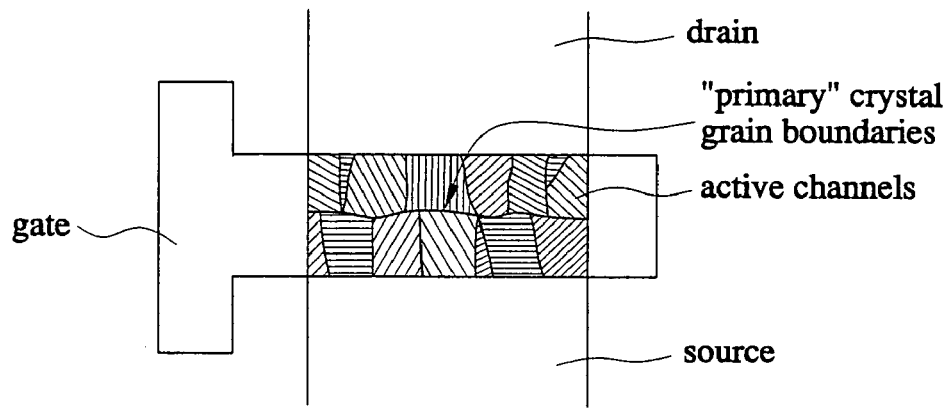
FIG. 2A and FIG. 2B are plan figures schematically illustrating active channels of TFTs including silicon grains having a large grain size formed by the SLS crystallization method
Figure 2B:
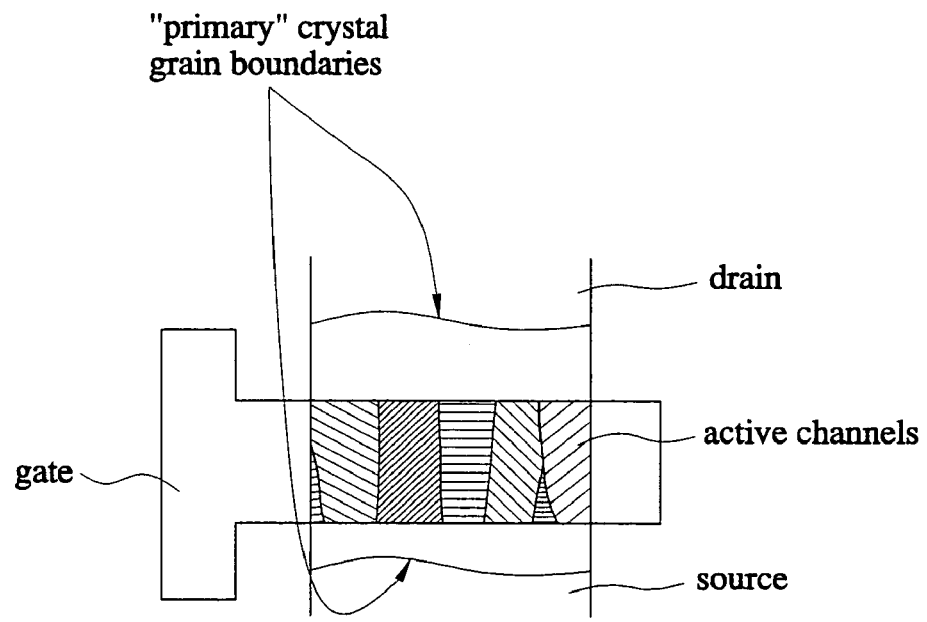
Figure 3A:
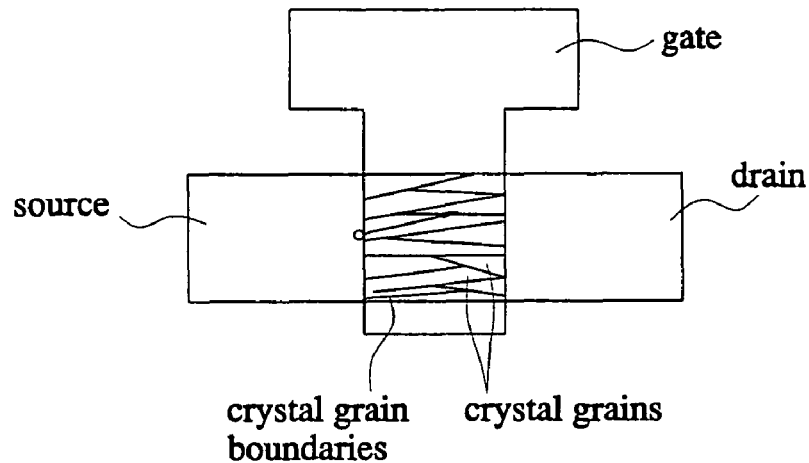
FIG. 3A to FIG. 3C are plan figures schematically illustrating active channels of TFTs fabricated according to other related art.
Figure 3B:
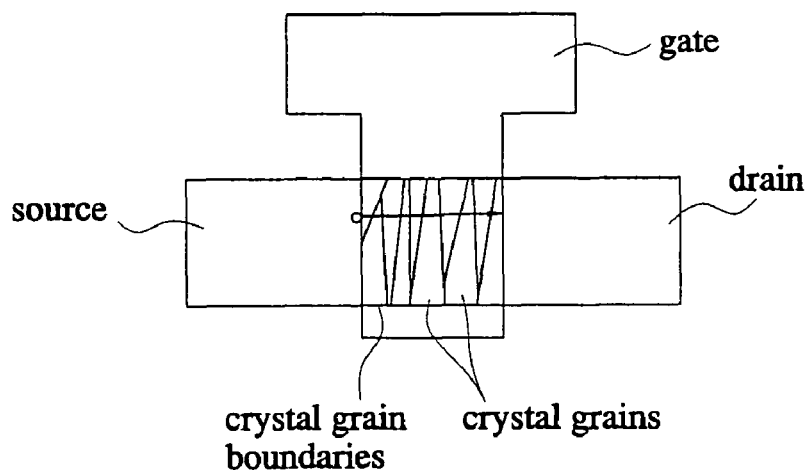
Figure 3C:
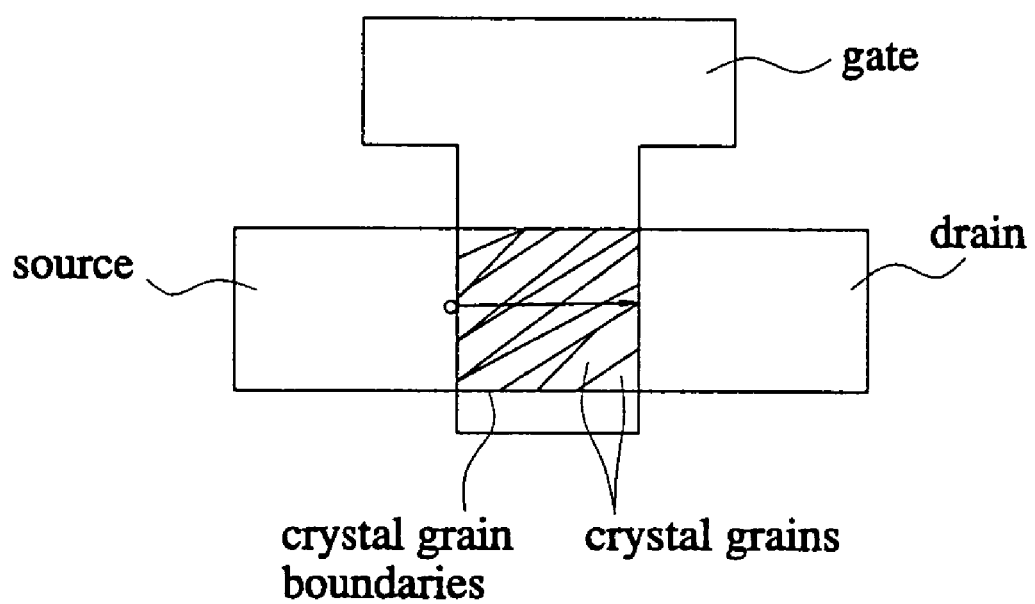

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Crystal grain boundaries are formed between adjacent crystal grains, due to a limited size of crystal grains, if crystal grains of polycrystalline silicon having an important effect on TFT characteristics, directly and indirectly, during fabrication of TFTs for active matrix displays are large and regularized for the improvement of the TFT characteristics.

In the present invention "crystal grain size" refers to the confirmable distance between crystal grain boundaries, and is generally defined as the distance between crystal grain boundaries belonging to the ordinary error range.

Crystal grain boundaries are generally divided into "primary" crystal grain boundaries, formed perpendicularly to a crystal growing direction, and "secondary" crystal grain boundaries, formed in the same direction as the crystal growing direction.

Figure 4A:
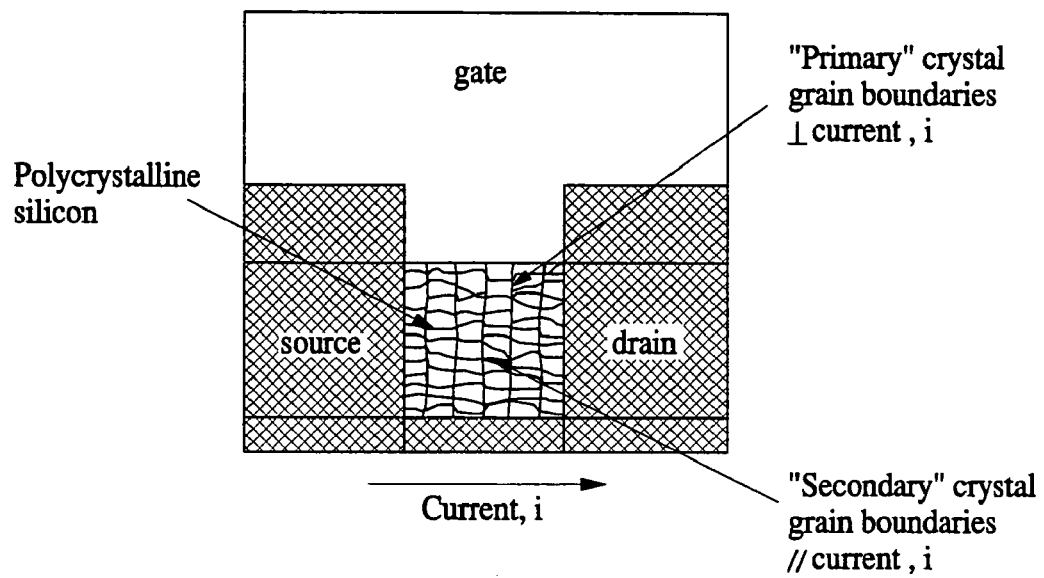
FIG. 4A is a drawing indicating that "primary" crystal grain boundaries in active channel regions are arranged perpendicularly to the direction of current flowing from source to drain.
Figure 4B:
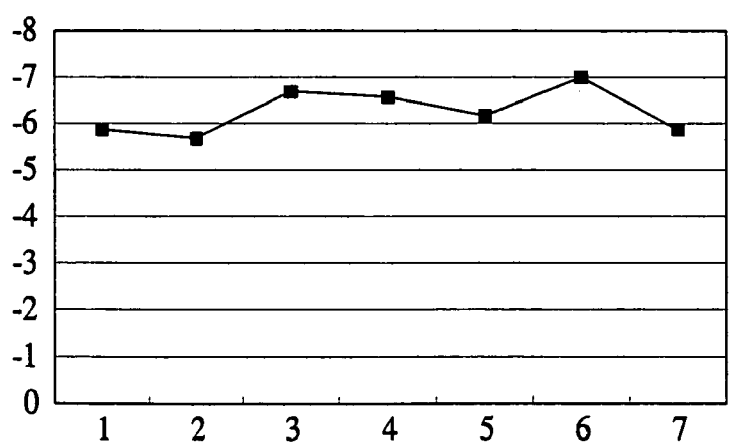
FIG. 4B is a drawing showing a Vth curve measured according to a position of a TFT in a substrate fabricated according to the arrangement of FIG. 4A.

FIG. 4A is a drawing indicating that the "primary" crystal grain boundaries in the active channel regions are arranged perpendicularly to the direction of current flowing from source to drain, and FIG. 4B is a drawing showing a Vth (threshold voltage) curve measured according to the position of the TFT in a substrate fabricated according to the arrangement of FIG. 4A.

Figure 5A:
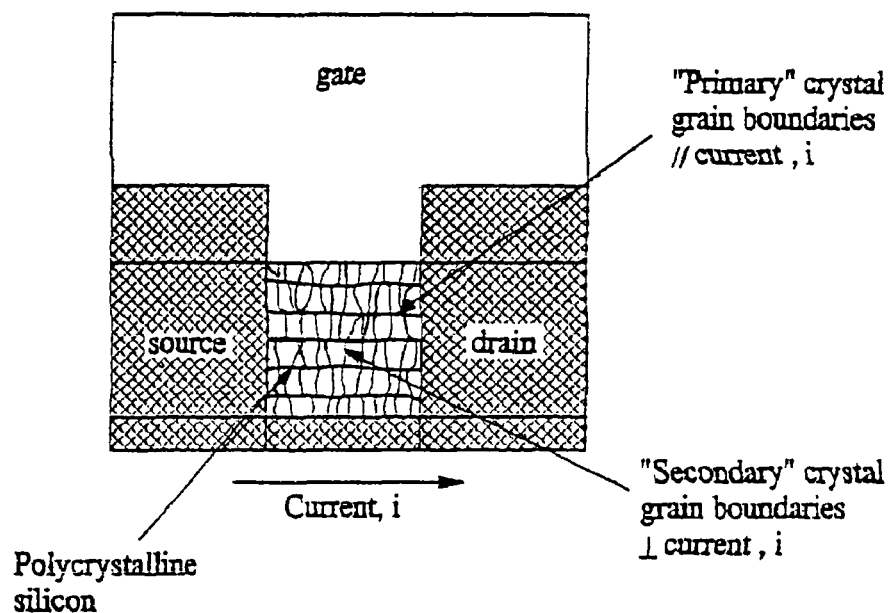
FIG. 5A is a drawing indicating that "primary" crystal grain boundaries in active channel regions are arranged parallel to the direction of current flowing from source to drain.
Figure 5B:
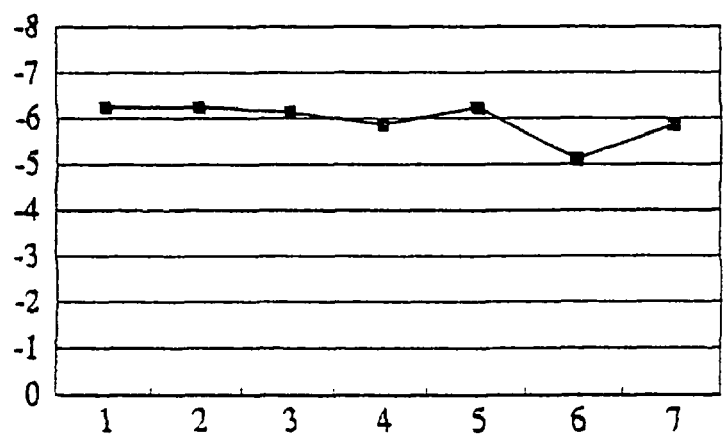
FIG. 5B is a drawing showing a Vth curve measured according to a position of a TFT in a substrate fabricated according to the arrangement of FIG. 5A.

FIG. 5A is a drawing indicating that the "primary" crystal grain boundaries in the active channel regions are arranged parallel to the direction of current flowing from source to drain, and FIG. 5B is a drawing showing a Vth curve measured according to the position of the TFT in a substrate fabricated according to the arrangement of FIG. 5A.

It is difficult to secure uniformity of TFTs since "primary" crystal grain boundaries function as a trap for the movement of charge carriers, the number of "primary" crystal grain boundaries in the active channel regions is relatively less than the number of "secondary" crystal grain boundaries parallel to or inclined to a growing direction of crystal grains, and the number of the "secondary" crystal grain boundaries is irregular depending on the position of the active channels in the case that the "primary" crystal grain boundaries are perpendicular to the direction of current flowing from source to drain of a TFT as shown in FIG. 4A. It can be seen that Vth is not constant, either, as illustrated in FIG. 4B.

However, current mobility characteristics are superior compared to the case in which "primary" crystal grain boundaries are parallel to the direction of current flowing from source to drain, as illustrated in FIG. 5A, since only the "primary" crystal grain boundaries function as a trap, while "secondary" crystal grain boundaries do not function as a trap for flowing current.

On the other hand, as described above, the uniformity of TFTs can be secured since variability for displacement of the active channels within the substrate is small (that is, there is a difference between the variability that occurs when the number of crystal grain boundaries is changed from one to two, and the variability that occurs when the number of crystal grain boundaries is changed from 100 to 102). Although current characteristics are bad, because the number of crystal grain boundaries that are a trap for the electric charge carriers is increased, and the electric charge carriers have to traverse a large number of crystal grain boundaries ("secondary" crystal grain boundaries) as illustrated in FIG. 5A (that is, in the case that the "primary" crystal grain boundaries are parallel to current direction), the uniformity of TFTs is improved. It can be seen in the Vth curve line illustrated in FIG. 5B that Vth is constantly maintained.

Namely, the "primary" crystal grain boundaries have a large variability for current movement according to the change of the number of crystal grain boundaries, while the "secondary" crystal grain boundaries have small variability for current movement according to the change of the number of crystal grain boundaries.

Therefore, a display device according to an embodiment of the present invention is fabricated in such a way that the "primary" crystal grain boundaries are parallel to a flow direction of current, as in FIG. 5A, since the uniformity of TFTs, rather than current characteristics, is required in a display region, that is, a region in which uniformity of TFT is particularly required in a display device, such as a region in which pixels are arranged.

Of course, the uniformity is not greatly influenced when the "primary" crystal grain boundaries form a certain angle to the direction of current flow, and the angle in which the "primary" crystal grain boundaries are inclined to a flow direction of current is preferably from −30° to 30°.

On the other hand, the less crystal grain boundaries capable of being a barrier there are, the better the mobility of current. Therefore, it is preferable to fabricate a driving region in such a manner that the flow of current is less influenced by a plurality of "secondary" crystal grains, although the movement of current is greatly influenced by the "primary" crystal grain boundaries, and the "primary" crystal grain boundaries are preferably inclined to a flow direction of current in an angle of 30° to 150° in the driving region.

In some embodiments, it may be preferable to fabricate the driving region in such a manner that the "primary" crystal grain boundaries are perpendicular to the flow direction of current as illustrated in FIG. 4A.

On the other hand, a polycrystalline silicon substrate used in the present invention is capable of growing crystal grains in a certain direction by the SLS method.

The foregoing device, according to an embodiment of the present invention, can be used as a semiconductor device or display device, and a liquid crystal display or organic electroluminescent (EL) device is preferably used as the display device.

A TFT fabricated according to an embodiment of the present invention is capable of making Vth and mobility characteristics more uniform, and preventing luminance non-uniformity of a display generated by non-uniformity of Vth all over the screen by designing the TFT so that the direction of active channels is perpendicular to secondary grain boundaries when fabricating driving TFTs of a display array using the SLS method.

Figure 6:
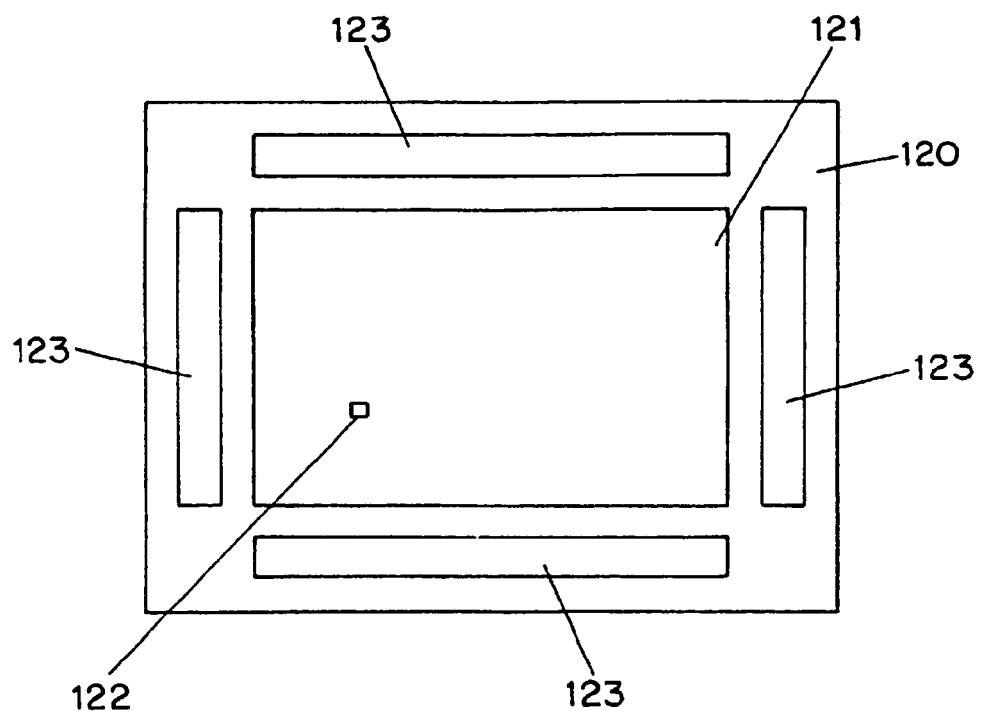
FIG. 6 is a drawing illustrating a display device having a display region and a driving region and a plurality of thin film transistors.

FIG. 6 is a drawing illustrating a display device. The display device includes a substrate 120, a display region 121 and driving regions 123. The display region 121 includes a regular array of pixels 122, each including a TFT pixel controller. Each pixel controller can be individually addressed by the drivers 123.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A display device with a polysilicon substrate, comprising:
    a display region;
    a driving region;
    a first plurality of thin film transistors, each transistor including a source, gate and drain region, and located in the display region;
    a second plurality of thin film transistors, each transistor including a source, gate and drain region, and located in the driving region;
    primary crystal grain boundaries in the polysilicon substrate in the display region and in the driving region;
    secondary crystal grain boundaries in the polysilicon substrate in the display region and in the driving region;
    wherein the primary crystal grain boundaries are located within the gate regions of the first plurality of thin film transistors and are inclined to a first direction of current flowing from source to drain of each of the first plurality of thin film transistors in the display region at an angle of −30° to 30° and the secondary crystal grain boundaries are located within the gate regions of the first plurality of thin film transistors and are inclined to a second direction of current flowing from source to drain of each of the first plurality of thin film transistors in the display region, and
    wherein the primary crystal grain boundaries are located within the gate regions of the second plurality of thin film transistors and are inclined to the second direction of current flowing from source to drain of each of the second plurality of thin film transistors in the driving region at an angle of 30° to 150° and the secondary crystal grain boundaries are located within the gate regions of the second plurality of thin film transistors and are inclined to the first direction of the current flowing from source to drain of each of the second plurality of thin film transistors in the driving region.

2. The display device according to claim 1, wherein the primary crystal grain boundaries of each of the first plurality of thin film transistors, are parallel to the first direction of current.

3. The display device according to claim 1, wherein the display device is an organic electroluminescent display device.

4. The display device according to claim 1, wherein the polysilicon substrate is fabricated by an SLS (sequential lateral solidification) method.

5. The display device according to claim 1, wherein the primary crystal grain boundaries of each of the second plurality of thin film transistors, are perpendicular to the second direction of current.

6. A display device with a polysilicon substrate comprising:
    driving and display regions, each having a plurality of thin film transistors formed thereon, and each thin film transistor including primary and secondary crystal grain boundaries;
    wherein the primary crystal grain boundaries in the polysilicon substrate formed in the driving region;
    are inclined to a direction substantially perpendicular to a current flowing from source to drain of each of the plurality of thin film transistors and the secondary crystal grain boundaries in the polysilicon substrate formed in the driving region are inclined to a direction substantially parallel to the current flowing from the source to the drain of each of the plurality of thin film transistors, and wherein the primary crystal grain boundaries in the polysilicon substrate formed in the display region are inclined to a direction substantially parallel to the current flowing from the source to the drain of each of the plurality of thin film transistors and the secondary crystal grain boundaries in the polysilicon substrate formed in the display region are inclined to a direction substantially perpendicular to the current flowing from the source to the drain of each of the plurality of thin film transistors.

7. The display device according to claim 6, wherein the polysilicon substrate is fabricated by an SLS (sequential lateral solidification) method.

8. A display device with a polysilicon substrate comprising:
   a display region;
   a driving region;
   a plurality of thin film transistors formed in the display and in the driving regions;
   primary and secondary crystal grain boundaries formed in the polysilicon substrate in the display and the driving regions;
   wherein the primary crystal grain boundaries formed in the display region are inclined to a direction of current flowing from source to drain at an angle of −30° to 30° and the secondary crystal grain boundaries formed in the display region are substantially perpendicular to the current flowing from the source to the drain; and
   wherein the primary crystal grain boundaries formed in the driving region are inclined to a direction of current flowing from source to drain at an angle of 30° to 150° and the secondary crystal grain boundaries formed in the driving region are substantially parallel to the current flowing from the source to the drain.

9. The display device according to claim 8, wherein the polysilicon substrate is fabricated by an SLS (sequential lateral solidification) method.

* * * * *

UNITED STATES PATENT AND TRADEMARK OFFICE
CERTIFICATE OF CORRECTION

PATENT NO.        : 7,750,348 B2
APPLICATION NO.   : 10/687993
DATED             : July 6, 2010
INVENTOR(S)       : Ok Byoung Kim et al.

It is certified that error appears in the above-identified patent and that said Letters Patent is hereby corrected as shown below:

Column 6, lines 62-63, delete ";" and continue from previous paragraph.

Signed and Sealed this

Nineteenth Day of October, 2010

David J. Kappos
*Director of the United States Patent and Trademark Office*